United States Patent
Kulp et al.

(10) Patent No.: US 7,479,463 B2
(45) Date of Patent: Jan. 20, 2009

(54) METHOD FOR HEATING A CHEMICALLY AMPLIFIED RESIST LAYER CARRIED ON A ROTATING SUBSTRATE

(75) Inventors: John Kulp, Canyon Lake, TX (US); Michael Carcasi, Austin, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 5 days.

(21) Appl. No.: 11/684,154

(22) Filed: Mar. 9, 2007

(65) Prior Publication Data
US 2008/0220340 A1 Sep. 11, 2008

(51) Int. Cl.
H01L 21/312 (2006.01)
(52) U.S. Cl. .................. 438/781; 430/350; 430/423; 430/426; 257/E21.027; 427/99.4
(58) Field of Classification Search ............ 427/99.4; 438/781; 257/E21.027; 430/350, 423, 426, 430/FOR. 109
See application file for complete search history.

(56) References Cited

U.S. PATENT DOCUMENTS

| | | | |
|---|---|---|---|
| 3,615,393 A * | 10/1971 | Krohn et al. ................ 430/40 |
| 5,158,616 A | 10/1992 | Kinoshita et al. |
| 5,261,431 A | 11/1993 | Ueno et al. |
| 5,339,539 A | 8/1994 | Shiraishi et al. |
| 5,361,787 A | 11/1994 | Miyazaki et al. |
| 5,369,891 A | 12/1994 | Kamikawa |
| 5,421,905 A | 6/1995 | Ueno et al. |
| 5,435,075 A | 7/1995 | Shiraishi et al. |
| 5,671,544 A | 9/1997 | Yokomizo et al. |
| 5,782,990 A | 7/1998 | Murakami et al. |
| 5,873,177 A | 2/1999 | Honda et al. |
| 6,001,191 A | 12/1999 | Kamikawa et al. |
| 6,119,367 A | 9/2000 | Kamikawa et al. |
| 6,180,320 B1 * | 1/2001 | Saito et al. .................. 430/311 |
| 6,203,627 B1 | 3/2001 | Shindo et al. |
| 6,241,827 B1 | 6/2001 | Tanaka et al. |
| 6,316,173 B1 * | 11/2001 | Irving et al. ................ 430/404 |
| 6,357,458 B2 | 3/2002 | Tanaka et al. |
| 6,575,178 B1 | 6/2003 | Kamikawa |
| 6,773,867 B2 * | 8/2004 | Nozaki et al. ............... 430/313 |
| 6,777,174 B2 * | 8/2004 | Ohshima .................... 430/543 |
| 6,797,456 B1 * | 9/2004 | Gu et al. .................... 430/312 |
| 6,800,422 B2 * | 10/2004 | Thackeray et al. .......... 430/311 |
| 6,866,986 B2 * | 3/2005 | Chun et al. ................. 430/311 |
| 6,952,294 B2 * | 10/2005 | Ishikawa et al. ............ 358/505 |
| 7,083,907 B2 * | 8/2006 | Sasaki et al. ................ 430/567 |
| 7,238,465 B2 * | 7/2007 | Ohshima .................... 430/502 |
| 7,387,969 B2 * | 6/2008 | Liu et al. .................... 438/717 |
| 2002/0058213 A1 * | 5/2002 | Mikoshiba et al. .......... 430/546 |
| 2003/0027086 A1 * | 2/2003 | Thackeray et al. .......... 430/330 |

(Continued)

OTHER PUBLICATIONS

Michael Carcasi, Apparatus And Method For Thermally Processing A Substrate With A Heated Liquid, U.S. Appl. No. 11/537,622, filed Sep. 30, 2006.

*Primary Examiner*—George Fourson
(74) *Attorney, Agent, or Firm*—Wood, Herron & Evans LLP

(57) ABSTRACT

Embodiments of an apparatus and methods for heating a substrate and a sacrificial layer are generally described herein. Other embodiments may be described and claimed.

10 Claims, 4 Drawing Sheets

U.S. PATENT DOCUMENTS

2003/0138724 A1* 7/2003 Nozaki et al. ............ 430/270.1
2004/0009437 A1* 1/2004 Chun et al. ................ 430/315
2004/0146803 A1* 7/2004 Kohl et al. .............. 430/270.1
2005/0199489 A1 9/2005 Stevens et al.
2005/0215025 A1* 9/2005 Chang et al. ................ 438/422
2005/0218003 A1 10/2005 Wang et al.
2006/0211254 A1* 9/2006 Liu et al. .................... 438/717
2008/0220340 A1* 9/2008 Kulp et al. .................... 430/4

* cited by examiner

METHOD FOR HEATING A CHEMICALLY AMPLIFIED RESIST LAYER CARRIED ON A ROTATING SUBSTRATE

FIELD OF THE INVENTION

The field of invention relates generally to the field of semiconductor integrated circuit manufacturing and, more specifically, relates to heating of a layer of the type used in semiconductor integrated circuit manufacturing that is carried on a rotating substrate.

BACKGROUND OF THE INVENTION

The manufacture of integrated circuits requires a method of forming patterns on wafers that is both accurate and precise to delineate areas for subsequent processing, such as dielectric deposition, ion implantation, and metallization. The process technology involved in the generation of these patterns is known as photolithography. A typical photolithography process sequence generally comprises the application of one or more uniform photoresist layers on the surface of a wafer substrate, drying and curing the deposited layers in a bake station, patterning the substrate by exposing the photoresist layer to electromagnetic radiation, and then developing the patterned photoresist layer.

The bake station in a photolithography tool is designed to heat wafers to process, cure, or activate a layer of material applied to the top surface of the wafer. The bake station comprises a bake plate, which is usually positioned below a wafer to heat the wafer backside without conducting heat directly to the back surface of the wafer. The heat is transferred to the wafer through an air gap using radiative and convective heat transfer. This configuration provides a way to heat the photoresist indirectly by transferring the heat through the air gap and substrate with minimal surface contact, which minimizes contamination due to physical contact to either the top or backside of the wafer.

However, the configuration of conventional bake stations may create two process control issues; temperature control of the hot plate and the control of heat transfer through the air gap. The bake plate temperature may be difficult to control during processing due to a rapid loss of energy when a cool wafer is placed in close proximity to the hot plate. Also, any variation in substrate flatness creates a non-uniform air gap spacing and may result in non-uniform heating of the wafer.

Further, conventional bake stations may also comprise a lid that prevents evolved solvents from escaping into the environment during processing while the photoresist layer is heated or cured. The lid may provide a cooler region where evolved solvents may condense, accumulate, and later fall back onto the topside of the wafer, thereby providing a source of contamination to the wafer.

What is needed, therefore, are improved apparatus and methods for heating a layer carried on a rotating substrate.

BRIEF DESCRIPTION OF THE DRAWINGS

The accompanying drawings, which are incorporated in and constitute a part of this specification, illustrate embodiments of the invention and, together with the detailed description of the embodiments given below, serve to explain the principles of the invention.

DETAILED DESCRIPTION

Figure 1:
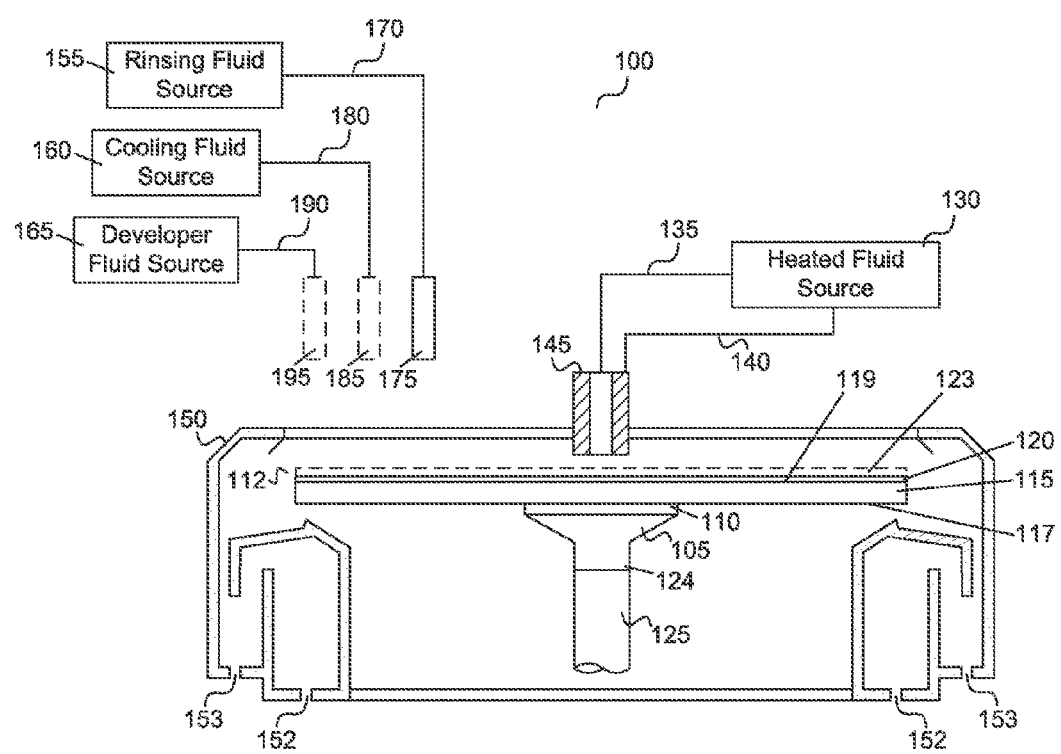
FIG. 1 is a side view illustration of a heated fluid bake system including a cup, a support structure, and a heated fluid nozzle in which a substrate carrying a sacrificial layer is placed on the substrate support.

An apparatus and method for heating a substrate and a sacrificial layer carried on the substrate with a fluid bake process is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for an economical method and apparatus for heating a layer carried on a substrate to, for example, cure a resist comprising the layer or to activate a chemically amplified resist comprising the layer. By providing methods and apparatus for a heated fluid bake, either a substrate carrying a sacrificial resist layer can be cured and, alternatively, a substrate carrying a sacrificial chemically amplified resist layer can be activated in the same process chamber as a subsequent cooling and develop process. This ability minimizes valuable process time, process variability due to process time, and related expense. One embodiment of the method comprises situating a first side of the substrate on a chuck. A heated fluid nozzle is then situated proximate to the sacrificial layer carried on a second side of the substrate.

While the chuck and substrate are rotated, a heated fluid is dispensed over the rotating substrate to heat and cure the sacrificial layer.

Figure 2:
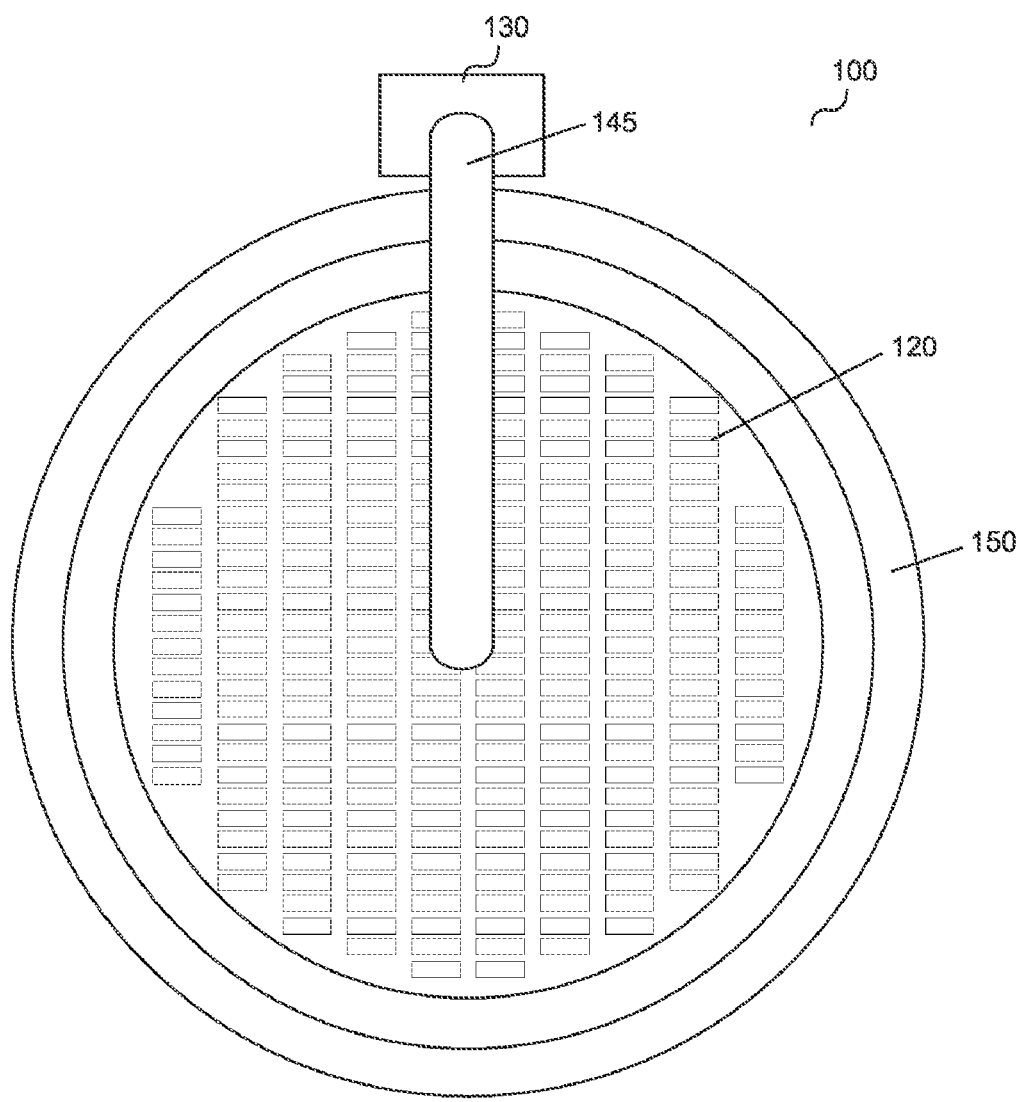
FIG. 2 is a top view of the heated fluid bake system of FIG. 1.

With reference to FIGS. 1 and 2, a heated fluid bake apparatus 100 may be used to heat a layer, such as a sacrificial layer 120 of a processable material, of a wafer 112 using a heated fluid. The wafer 112 comprise a substrate 115, the sacrificial layer 120 carried on one side 119 of the substrate 115, and an optional top coat layer 123 on the sacrificial layer 120. The sacrificial layer 120 may be patterned in a conventional manner understood by a person having ordinary skill in the art or may be un-patterned. The substrate 115, which may comprise a polished silicon or a silicon germanium substrate, also has an un-patterned side 117 that is opposite to side 119.

The sacrificial layer 120 may comprise a negative resist, a positive resist, or a dual-tone (positive-negative) resist. A resist typically may include a polymer, a sensitizer, a solvent, and other additives. In a negative tone resist, the chemical bonds are cross-linked after exposure to light, which allows a subsequent developer step to wash away the unexposed areas. In a positive tone resist, chemical bonds are broken after exposure to light, which allows the developer to wash away the exposed areas. A dual-tone resist can share characteristics of both positive and negative type resists. In one embodiment, the resist is a photoresist, or a light-sensitive coating, that is temporarily applied to the substrate 115 to allow the transfer of an optical image from a mask to the surface of the substrate. The resist is applied to a top surface of the substrate 115 using a spin-on process, soft-baked, exposed, post-exposure baked, developed, and hard-baked before subsequent processing. The heated fluid may be used during the post-exposure baking to evolve solvent from the resist and to strengthen the resist for subsequent processing.

Alternatively, the sacrificial layer 120 may comprise a chemically amplified (CA) positive or negative photoresist, in which a catalytic species generated by irradiation during exposure induces a cascade of subsequent chemical transformations under heat activation. The heated fluid post-exposure bake process may be applied to activate an acid in the CA photoresist in a reaction that alters the solubility properties of the CA photoresist in the irradiated areas, as in the case of a positive CA photoresist.

In one embodiment, the optional top coat layer 123 is in direct contact with the sacrificial layer 120. The top coat layer 123 may be a top anti-reflective coating (TARC) material and barrier layer, which is commonly used in immersion lithography applications. The top coat layer 123, which is applied to the sacrificial layer 120 by techniques understood by a person having ordinary skill in the art, may prevent the sacrificial layer 120 from contaminating the heated fluid. The top coat layer 123 may also be used to prevent the heated liquid from contacting and modifying the properties of the sacrificial layer 120.

With continued reference to FIGS. 1 and 2, the heated fluid bake apparatus 100 comprises a drive spindle 125 and a support structure, or chuck 105, with a first end 110 configured for holding the substrate 115 and a second end 124 configured to be coupled with the drive spindle 125. The heated fluid bake apparatus 100 is located inside a process chamber (not shown), which may be open to ambient air or it may be enclosed in an environmentally controlled process chamber. The drive spindle 125 may be part of a stepper motor, an electrically driven armature, or a pneumatically driven shaft, though the embodiment is not so limited. The substrate 115 may be placed on the chuck 105 either manually or through automatic means by raising and lowering the chuck using drive spindle 125, and/or alternatively by transferring the substrate 115 to and from the chuck 105 using a multi-axis robot (not shown).

The chuck 105 may be constructed from Delrin® or polyether ether ketone (PEEK), though the embodiment is not so limited. Further, the chuck may be coated or capped with an insulating layer on the first end 110 to reduce heat transfer from the wafer to the chuck 105. The chuck 105 is designed to rotate about a central axis. The substrate 115 may be centrally attached to the chuck 105 using a vacuum, mechanical, or an electrostatic means known to one normally skilled in the art. The chuck 105 contacts the substrate 115 on the un-patterned side 117. The absence of a patterned layer on the un-patterned side 117 may enable the chuck 105 to form a vacuum seal.

The heated fluid bake apparatus 100 further comprises a dispenser having the form of a heated fluid nozzle 145 located proximate to the top surface of the sacrificial layer 120 and a heated fluid source 130, such as a constant temperature bath known to those skilled in the art, connected through a heated fluid transfer line 135 with the heated fluid nozzle 145. The heated fluid nozzle 145 may be movable between a first position above the sacrificial layer 120 to dispense the heated fluid and a second position, such as outside the cup 150, to allow the wafer 112 to be placed on the chuck 105 and removed from the chuck 105.

The heated fluid source 130 may deliver one or a combination of fluids such as water, de-ionized water, developer fluid, and a top anti-reflective coating solvent. In one embodiment, the developer fluid is an aqueous base such as tetramethyl ammonium hydroxide (TMAH). The top anti-reflective coating solvent may be TMAH or another aqueous base developer.

The heated fluid nozzle 145 is designed to maintain a heated fluid setpoint temperature. The distance from the end of the heated fluid nozzle 145 to the surface of the sacrificial layer 120 is minimized to reduce heat loss from the heated fluid to the atmosphere. As a result, the sacrificial layer 120 may be heated to a temperature approximately equal to the heated fluid setpoint temperature by dispensing a stream of heated fluid on the wafer 112. The heated fluid setpoint temperature may be controlled in the heated fluid nozzle 145 using a dual walled heat exchanger or an electrically powered thermal jacket, though the embodiment is not so limited. The dual walled heat exchanger is connected to a re-circulating fluid flow 140 to control the temperature in the heated fluid nozzle 145. Alternatively, the heated fluid setpoint temperature may be established by mixing a plurality of fluids (not shown) from a plurality of temperature controlled fluid sources (not shown) prior to applying the heated fluid to the wafer 112.

Substantially a catch cup 150 captures all of the fluid from the heated fluid source 130 as it is dispensed on the sacrificial layer 120 and spun-off in a radially outward manner. Material captured by the cup 150 may be removed by draining liquids through a liquid drain port 153 and exhausting vapors through a vapor exhaust port 152.

The heated fluid bake apparatus 100 further comprises a rinsing fluid source 155, such as a de-ionized water source, used to displace and remove heated fluid from the sacrificial layer 120. In one embodiment, rinsing fluid from the rinsing fluid source 155 is delivered through a rinsing fluid delivery line 170 and dispensed on the sacrificial layer 120 through a rinsing fluid nozzle 175. The rinsing fluid is dispensed from the rinsing fluid nozzle 175 either at a center location of the wafer 112 or at some location along the radius of the wafer 112 to rinse the sacrificial layer, though the embodiment is not so limited.

The heated fluid bake apparatus 100 may further comprise a cooling fluid source 160 and a cooling fluid delivery nozzle 185 coupled by a cooling fluid delivery line 180 with the cooling fluid source 160. The cooling fluid source 160 and cooling fluid delivery nozzle 185 cooperate for delivering a cooling fluid, such as de-ionized water, to the sacrificial layer 120 to cool the sacrificial layer 120. The cooling fluid is dispensed either at a center location or at a location along the radius of the wafer 112 to cool or retard subsequent chemical reactions within the sacrificial layer 120, though the embodiment is not so limited.

The temperature of the heated fluid, which is at least partially contingent upon the composition of material forming the sacrificial layer 120, exceeds room temperature and is typically in the range of about 40° C. to about 125° C. The cooling fluid is dispensed at a temperature lower than the initial temperature of the heated fluid and typically is at or below room temperature (i.e., about 25° C.). In one embodiment, the temperature of the cooling fluid may range from about 15° C. to about 25° C.

The heated fluid bake apparatus 100 may further comprise a developer fluid source 165 that delivers a developer fluid, such as TMAH, at a substantially constant temperature onto the sacrificial layer 120. The developer fluid is routed from the developer fluid source 165 through a developer fluid line 190 to a developer fluid nozzle 195 from which the developer fluid is dispensed onto the sacrificial layer 120. The developer fluid is dispensed from the developer fluid nozzle 195 either at a center location or at a location along the radius of the wafer 112 to develop a portion of the sacrificial layer. In one embodiment, a cooling fluid is applied to the sacrificial layer 120 to cool the sacrificial layer 120 before the application of the developer fluid.

In one embodiment, the heated fluid bake process may be performed by heating the CA resist using a heated developer fluid to activate an acid in a CA resist. In this embodiment, the developer fluid is used to activate an acid in a CA resist and to develop portions of the CA resist. This embodiment incrementally activates an acid in a CA resist, and then develops incremental portions of the CA resist to allow the adjustment of a feature profile or a possible reduction of line edge roughness of the sacrificial layer 120.

Figure 3:
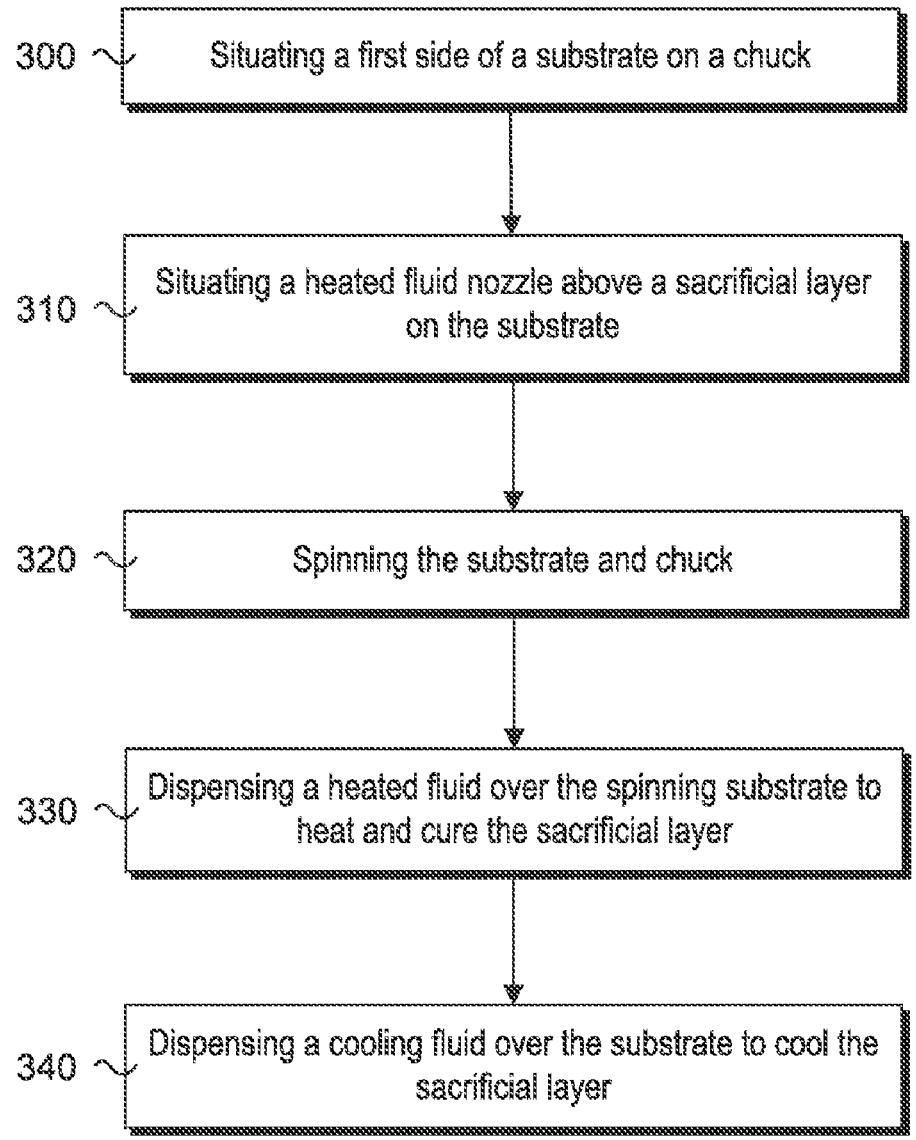
FIG. 3 is a flowchart illustrating an embodiment of a heated fluid bake process used to heat and cool a sacrificial layer carried on a rotating substrate.

FIG. 3 is a flowchart illustrating one embodiment of a heated fluid bake process used to cure or activate a chemically amplified sacrificial layer 120 using a heated fluid bake apparatus 100 as illustrated in FIGS. 1, 2. In block 300, the bake process is initiated by placing or situating the unpatterned side 117 of the substrate 115 on the chuck 105 by substantially centering the substrate 115 on the center of the chuck 105. In block 310, the heated fluid nozzle 145 is then situated above the sacrificial layer 120 on the substrate 115.

In block 320, the wafer 112 and the chuck 105 are rotated about a central axis. In block 330, a heated fluid is dispensed at a center location, at a location along the radius of the wafer 112, or dynamically across the surface of the wafer to heat and cure the sacrificial layer 120, though the embodiment is not so limited. The rotation of the wafer 112 spins and disperses the heated fluid across the surface of the sacrificial layer 120 uniformly so that the sacrificial layer 120 is evenly heated. In one embodiment, the rotational speed (i.e., angular velocity) of the wafer 112 is between about 10 revolutions per minute (rpm) and about 300 rpm. In another embodiment, the rotational speed of the wafer 112 is between about 300 rpm and about 500 rpm. The rotational speed of the wafer 112 is established to achieve uniform heating of the sacrificial layer 120. For example, by applying the heated fluid with the heated fluid nozzle 145, the temperature of the sacrificial layer 120 is heated to within ≅0.5° C. across the entire surface of the wafer 112. A more critical process, requiring tighter temperature uniformity tolerances, provides uniform heating across the sacrificial layer 120 to within ±0.1° C. The heated fluid is dispensed across the wafer 112 to sufficiently heat and cure or activate the sacrificial layer 120 for a period of about 30 seconds to about 90 seconds, though the embodiment is not so limited.

In block 340, a cooling fluid is dispensed over the substrate 115 to cool the sacrificial layer 120. The cooling fluid may be at least one of de-ionized water, a developer solution, or a top coat solvent. In one embodiment, the cooling fluid is dispensed at a temperature between about 15° C. and about 25° C. The rotational speed of the wafer is sufficient to evenly distribute the cooling fluid across the top surface of the wafer 112. In one embodiment, the rotational speed of the wafer 112 while dispensing the cooling fluid is between about 10 rpm and about 300 rpm. In another embodiment, the rotational speed of the wafer 112 is between about 200 rpm and about 400 rpm.

Figure 4:
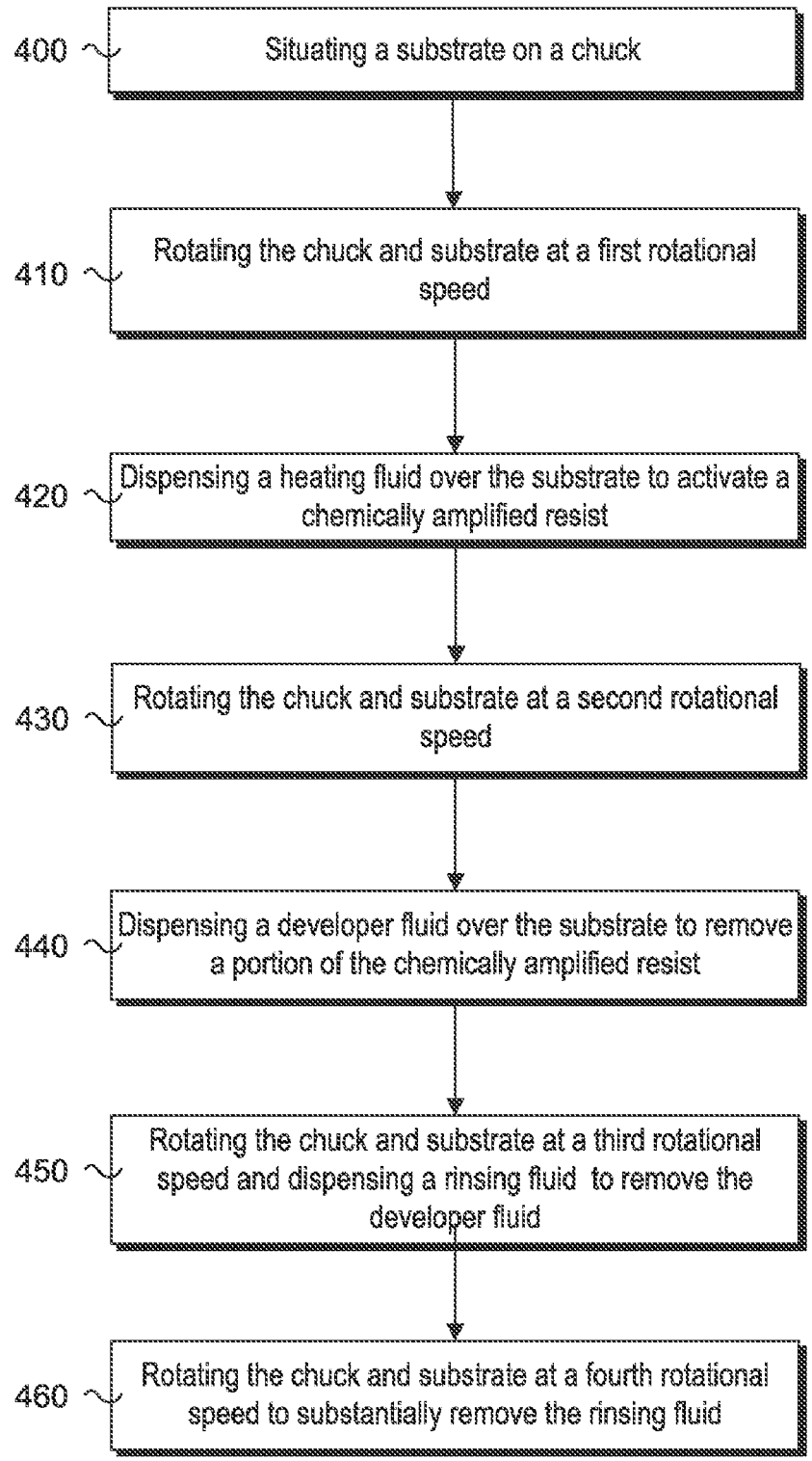
FIG. 4 is a flowchart illustrating an embodiment of a heated fluid bake process used to activate and develop a chemically amplified resist carried on a rotating substrate.

FIG. 4 is a flowchart illustrating an embodiment of a heated fluid bake process used to activate and develop a sacrificial layer 120 comprising a chemically amplified resist and using a heated fluid bake apparatus 100 as illustrated in FIGS. 1, 2. The process may be initiated (element 400) by situating the unpatterned side 117 of the substrate 115 on the chuck 105 by substantially centering the substrate 115 on the center of the chuck 105.

In block 410, the wafer 112 and the chuck 105 are rotated about a central axis at a first rotational speed (i.e., first angular velocity). In block 420, a heated fluid is dispensed at a center location of the wafer 112, at a location along the radius of the wafer 112, or dynamically across the wafer 112 by rotating or cycling a heated fluid nozzle 145 back and forth to heat and activate a chemically amplified resist sacrificial layer 120. The rotation of the wafer 112 spins and uniformly disperses the heated fluid across the top surface of the sacrificial layer 120 to evenly heat the sacrificial layer. In one embodiment, the first rotational speed of the wafer is between about 250 rpm and about 350 rpm. The heated fluid is dispensed across the wafer 112 to sufficiently activate the sacrificial layer 120 for a period of about 30 seconds to about 90 seconds, though the embodiment is not so limited.

In blocks 430 and 440, the substrate is rotated at a second rotational speed and a developer fluid is dispensed to remove a portion of the chemically amplified resist. In one embodiment, the second rotational speed is zero, thereby allowing the developer fluid to pool and partially remove the sacrificial layer 120. In another embodiment, the second rotational speed is between about 10 rpm and about 100 rpm, which allows the developer fluid to flow across the wafer 112 while removing a portion of the sacrificial layer 120. Alternatively, the wafer 112 may be initially static to allow a pool of developer fluid to remove a portion of the sacrificial layer 120 and, subsequently, rotated at a second rotational speed to mechanically disperse the developer fluid across the wafer 112. The developer fluid may be applied to the sacrificial layer 120 for a period of about 20 seconds to about 80 seconds, though the embodiments of the invention are not so limited.

Alternatively, the heated fluid bake process may be applied by heating the CA resist using a heated developer fluid to activate an acid in a CA resist. In this embodiment, the developer fluid is used to activate an acid in a CA resist and to develop and remove portions of the CA resist. This embodiment provides a method for incrementally activating an acid in a CA resist then developing incremental portions of the CA resist to allow the adjustment of a feature profile or a possible reduction of line edge roughness of the sacrificial layer 120.

In block 450, a rinsing fluid is dispensed over the wafer 112 at a third rotational speed to remove the developer fluid from the sacrificial layer 120. In one embodiment, the rinsing fluid is de-ionized water. The third rotational speed of the chuck 105 and wafer 112 may be between about 500 rpm and about 2000 rpm, though the embodiment is not so limited. The rinsing fluid may be applied to the sacrificial layer 120 for a period of about 10 seconds to about 40 seconds. In block 460, the chuck 105 and wafer 112 are rotated at a fourth rotational speed to substantially remove the rinsing fluid (element 460). In one embodiment, the fourth rotational speed is between about 3000 rpm and about 5000 rpm to sufficiently dry the surface of the sacrificial layer 120.

A plurality of embodiments of heating a substrate and sacrificial layer with a heated fluid bake process have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a patterned side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The terms "on", "above" or "over" as used herein (including in the claims) do not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for processing a chemically amplified resist carried on a substrate, the method comprising:
   rotating the substrate at a first rotational speed;
   contacting the chemically amplified resist with a fluid heated to a temperature effective to activate the chemically amplified resist; and
   contacting the substrate with a developer fluid effective to remove a portion of the chemically amplified resist after the chemically amplified resist is activated by contact with the heated fluid.

2. The method of claim 1 further comprising.
   rotating the substrate at a second rotational speed while the chemically amplified resist is contacted with the developer fluid.

3. The method of claim 2 wherein the first rotational speed is substantially equal to the second rotational speed.

4. The method of claim 1 wherein the heated fluid and the developer fluid are the same fluid.

5. The method of claim 1 further comprising:
   contacting the chemically amplified resist with a cooling fluid before contacting the chemically amplified resist is contacted with the developer fluid.

6. The method of claim 5 further comprising:
   contacting the chemically amplified resist with a rinsing fluid to substantially remove the developer fluid.

7. The method of claim 6 further comprising:
   rotating the chuck and substrate at a third rotational speed to substantially remove the rinsing fluid with centrifugal forces.

8. A method of processing a chemically amplified resist layer on the substrate, the method comprising:
   rotating the substrate; and
   contacting the chemically amplified resist layer with a heated developer fluid at a temperature effective to activate the chemically amplified resist and, after activation, effective to partially remove the chemically amplified resist layer.

9. The method of claim 8 further comprising:
   dispensing a cooling fluid onto the chemically amplified resist layer after the heated developer fluid is dispensed onto the chemically amplified resist layer.

10. The method of claim 8 further comprising:
    dispensing a rinsing fluid onto the chemically amplified resist layer, wherein the rinsing fluid is effective to remove the developer fluid.

* * * * *

UNITED STATES PATENT AND TRADEMARK OFFICE
CERTIFICATE OF CORRECTION

PATENT NO. : 7,479,463 B2  Page 1 of 1
APPLICATION NO. : 11/684154
DATED : January 20, 2009
INVENTOR(S) : John Kulp et al.

It is certified that error appears in the above-identified patent and that said Letters Patent is hereby corrected as shown below:

In column 1, line 40, change ";" to --:--.

In column 2, line 34, change "do" to --does--.

In column 3, line 7, change "comprise", to --comprises--.

In column 6, line 1, change "≅" to --±--.

In column 7, line 45, change "applicant" to --applicants--.

In column 8, claim 2, line 15, change "." to --:--.

Signed and Sealed this

Twenty-fifth Day of August, 2009

David J. Kappos
*Director of the United States Patent and Trademark Office*